United States Patent [19]

Kim

[11] Patent Number: 5,729,050
[45] Date of Patent: Mar. 17, 1998

[54] SEMICONDUCTOR PACKAGE SUBSTRATE AND BALL GRID ARRAY (BGA) SEMICONDUCTOR PACKAGE USING SAME

[75] Inventor: Jin Sung Kim, Cheongju, Rep. of Korea

[73] Assignee: LG Semicon Co., Ltd., Cheongju, Rep. of Korea

[21] Appl. No.: 751,672

[22] Filed: Nov. 18, 1996

[30] Foreign Application Priority Data

Mar. 11, 1996 [KR] Rep. of Korea ............... 1996/6374

[51] Int. Cl.⁶ ........................... H01L 23/28; H01L 23/52
[52] U.S. Cl. ................... 257/667; 257/687; 257/738; 257/790; 257/795; 257/730; 257/693; 257/678
[58] Field of Search ......................... 257/667, 680, 257/678, 683, 687, 693, 729, 730, 735, 737, 738, 788, 790, 795, 774, 787

[56] References Cited

U.S. PATENT DOCUMENTS

| | | | |
|---|---|---|---|
| 4,374,457 | 2/1983 | Wiech, Jr. | 257/774 |
| 5,157,475 | 10/1992 | Yamaguchi | 257/787 |
| 5,347,162 | 9/1994 | Pasch | 257/780 |
| 5,355,283 | 10/1994 | Marrs et al. | 257/687 |
| 5,397,917 | 3/1995 | Ommen et al. | 257/698 |
| 5,467,253 | 11/1995 | Heckman et al. | 257/698 |
| 5,468,999 | 11/1995 | Lin et al. | 257/787 |
| 5,506,446 | 4/1996 | Hoffman et al. | 257/698 |
| 5,508,556 | 4/1996 | Lin | 257/698 |
| 5,561,322 | 10/1996 | Wilson | 257/786 |
| 5,594,626 | 1/1997 | Rostoker et al. | 257/787 |
| 5,605,863 | 2/1997 | Wills et al. | 437/182 |
| 5,612,576 | 3/1997 | Wilson et al. | 257/790 |

FOREIGN PATENT DOCUMENTS

| | | | |
|---|---|---|---|
| 60-154543 | 8/1985 | Japan | 257/790 |
| 4-340750 | 11/1992 | Japan | 257/787 |

*Primary Examiner*—Tom Thomas
*Assistant Examiner*—Alexander Oscar Williams
*Attorney, Agent, or Firm*—Fleshner & Kim

[57] ABSTRACT

A semiconductor package substrate and a ball grid array (BGA) semiconductor package using the same include a cavity formed in the substrate, anti-cracking bumpers on the inner substrate surface adjacent to the cavity and a plurality of holes and recesses in the substrate, whereby delamination and cracking which may occur during the credibility checkup can be prevented, thereby improving the package reliability.

25 Claims, 5 Drawing Sheets

FIG. 1
CONVENTIONAL ART
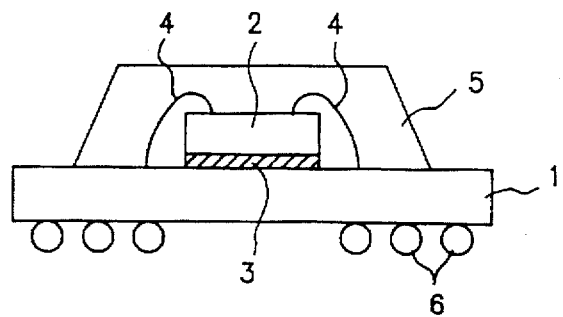
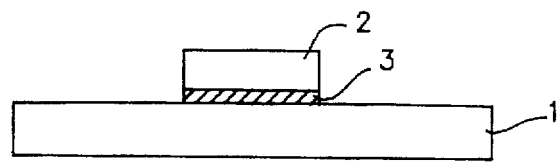
FIG. 3A
CONVENTIONAL ART
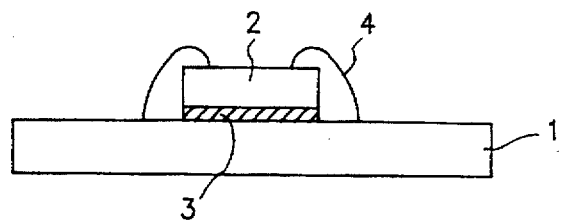
FIG. 3B
CONVENTIONAL ART
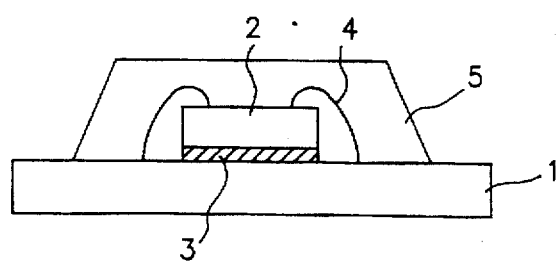
FIG. 3C
CONVENTIONAL ART
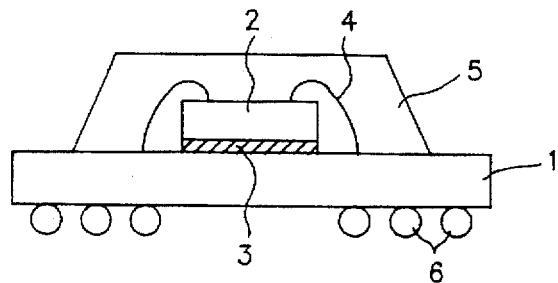
FIG. 3D
CONVENTIONAL ART

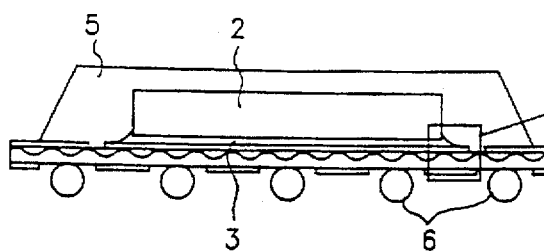
FIG. 4A
CONVENTIONAL ART
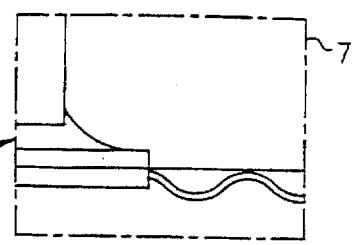
FIG. 4B
CONVENTIONAL ART
FIG. 5
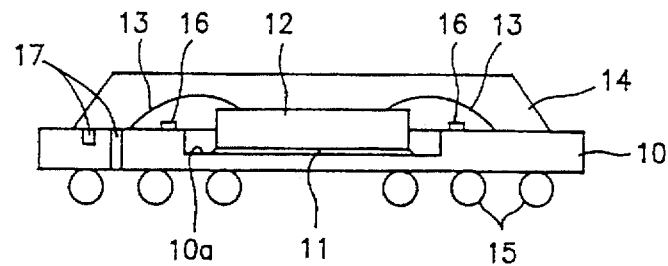
FIG. 7A
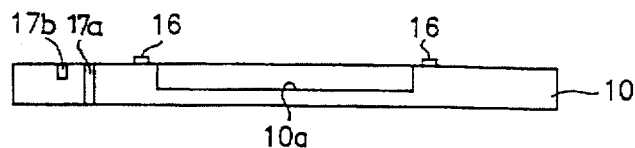
FIG. 7B
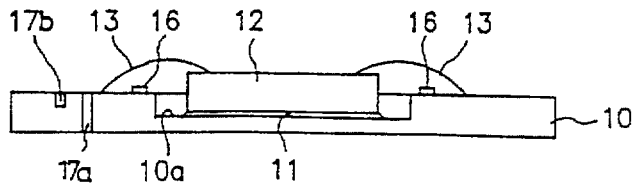
FIG. 7C
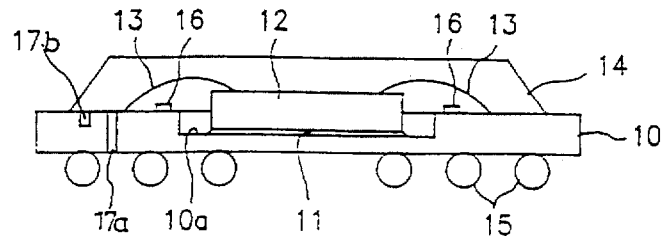

FIG. 8A
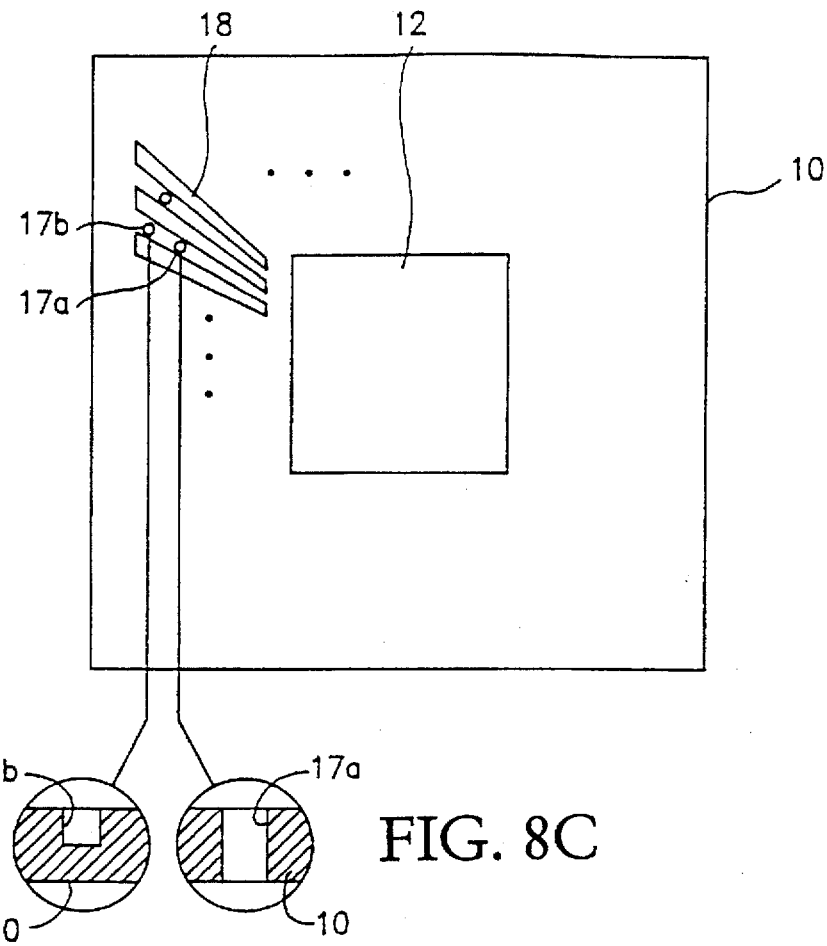
FIG. 8B     FIG. 8C
FIG. 9
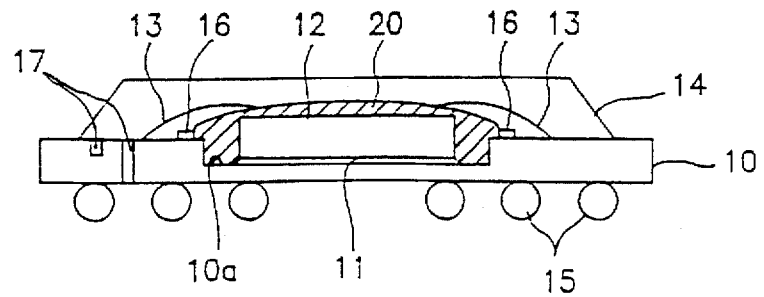

SEMICONDUCTOR PACKAGE SUBSTRATE AND BALL GRID ARRAY (BGA) SEMICONDUCTOR PACKAGE USING SAME

TECHNICAL FIELD

The present invention relates to a semiconductor package, more particularly, to a semiconductor package substrate and a ball grid array (BGA) package.

BACKGROUND ART

Ball grid array (hereinafter, "BGA") type semiconductor package is known as one of the most popular multi-pin packages in recent years. This package has three times as wide a lead pitch compared to a quad flat package (hereinafter, "QFP") which enables arraying twice as many pins therein as in the QFP. Further, as the outlead widths of the QFP become smaller, its pitch intervals become narrower. Hence, when mounted on a PCB (printed circuit board), QFP tends to have difficulty in the package alignment and soldering amount control.

In case of a BGA package, solder balls thereof serve as outleads, such that the above-described QFP disadvantage problems is solved. Because the electric path from a package chip to a solder ball is short enough, the electric resistance is decreased, and improved electric properties can be obtained.

FIG. 1 is a cross-sectional view of a conventional BGA semiconductor package structure. A package chip 2 is attached by an adhesive 3 to a substrate 1. One end portions of copper wires (not shown) embedded in the package chip 2 and the substrate 1 are electrically connected by metallic wires 4. An epoxy molding compound 5, covering the package chip 2 and the metallic wires 4, is formed on the substrate surface. A plurality of solder balls 6 is provided on the lower surface of the substrate 1 so as to be connected to the other end portions of the copper wires embedded in the substrate 1.

FIG. 2 is a flow chart showing substrate fabrication orders of the conventional BGA semiconductor package. The fabrication sequentially follows the flow chart orders; thin core lamination→inner circuit formation and test→removing foreign substances from circuit surface→lamination→drill→hole cleaning→electroless copper plating→outer circuit formation→copper electroplating→resist exfoliation→etching→solder resist→outer surface processing→final test.

A fabrication method for a printed wiring board, which is employed as the conventional BGA package substrate 1, is identical to that of a general PCB. That is, the fabrication of a general BGA package substrate is completed by performing lamination and photo etching, wherein copper wires serving as multi-layer electric circuit wires are embedded in the substrate.

FIGS. 3A through 3D illustrate the fabrication method of the conventional BGA semiconductor package. As shown in FIG. 3A, a die bonding is performed so as to attach a package chip 2, processed through a sawing step, to the center surface of a substrate 1 having an adhesive 3 provided thereon. Then, as shown in FIG. 3B, a plurality of chip pads (not shown) are electrically connected to copper wires (not shown) embedded in the substrate 1 by a wire bonding technique.

Thereafter, as shown in FIG. 3C, the package chip 2 and the metallic wires 4 along with a portion of the substrate surface are molded by an epoxy molding compound 5.

Finally, as shown in FIG. 3D, under a solder ball bonding technique, a plurality of solder balls 6 is attached to the lower surface of the substrate 1 so that the other end portions of the copper wires (not shown) are electrically connected thereto.

Since the substrate surface is formed flat, the above-described conventional BGA package lacks an adhesive strength between the epoxy molding compound 5 and the substrate 1. Because the substrate 1 is a laminate structure, the hygroscopic rate between the damp amount therein at a saturation level and the package mass thereof reaches up to 0.3 to 0.6 percents.

Hence, conventional package can be subjected to delaminations and crackings, caused by a steam pressure occurring within the substrate 1. As a result, the reliability of the package is reduced and there are limitations to improvements. Additionally, the conventional BGA package has shown low levels of reliability at JODEC (Joint Electron Device Engineering Council) by merely reaching JODEC grade III to V at its Infrared ray Reflow (I.R) test. Further, as shown in FIG. 4 and in detail, defection sources, such as delaminations and crackings, have tendency to spread externally via the package chip, shown by the wavy line.

DISCLOSURE OF THE INVENTION

An advantage of the present invention is in providing chip packages of high quality.

Another advantage of the present invention is in enhancing reliability of packages.

Another advantage of the present invention is in preventing delamination.

Another advantage of the present invention is in preventing cracking of the chip package.

The above advantages and others are achieved at least in part by a substrate for a chip package comprising: a cavity formed in the substrate; at least one bumper formed on the substrate adjacent to the cavity; and at least one of a plurality of holes and a plurality of recesses formed on the substrate.

The present invention is achieved at least in part by a chip package comprising: a substrate having a plurality of conductive leads, a cavity at least one bumper formed adjacent to the cavity and a plurality of holes and recesses; a package chip having a plurality of bond pads mounted on the bottom surface of the cavity; means for connecting the bonding package pads of the package chip and the plurality of conductive leads and the substrate; and a molding compound, formed on the substrate, for packaging the package chip and the connecting means and filling the holes and the recesses.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 is a cross-sectional view of a conventional BGA semiconductor package structure;

FIGS. 3A through 3D are cross-sectional views of making a conventional BGA semiconductor package structure;

FIG. 4 is a cross-sectional view and its partial enlargement view which illustrates a reliability test level of the conventional BGA semiconductor package structure;

FIG. 5 is a cross-sectional view showing a BGA semiconductor package in accordance with the present invention;

FIGS. 7A through 7C are cross-sectional views showing the BGA semiconductor package fabrication process in accordance with the present invention, wherein, FIG. 7A is a cross-sectional view of the substrate structure, FIG. 7B is a cross-sectional view of the die-bonding and wire bonding structure, and FIG. 7C is a cross-sectional view of the molding and the solder ball attachment structures;

FIG. 8 is a plan view showing the BGA semiconductor package structure of the present invention and its partial enlargement views for showing holes and recesses formed respectively in the substrate; and FIG. 9 is a cross-sectional view of an embodiment transformed from FIG. 5.

BEST MODE FOR CARRYING OUT THE INVENTION

Figure 2:
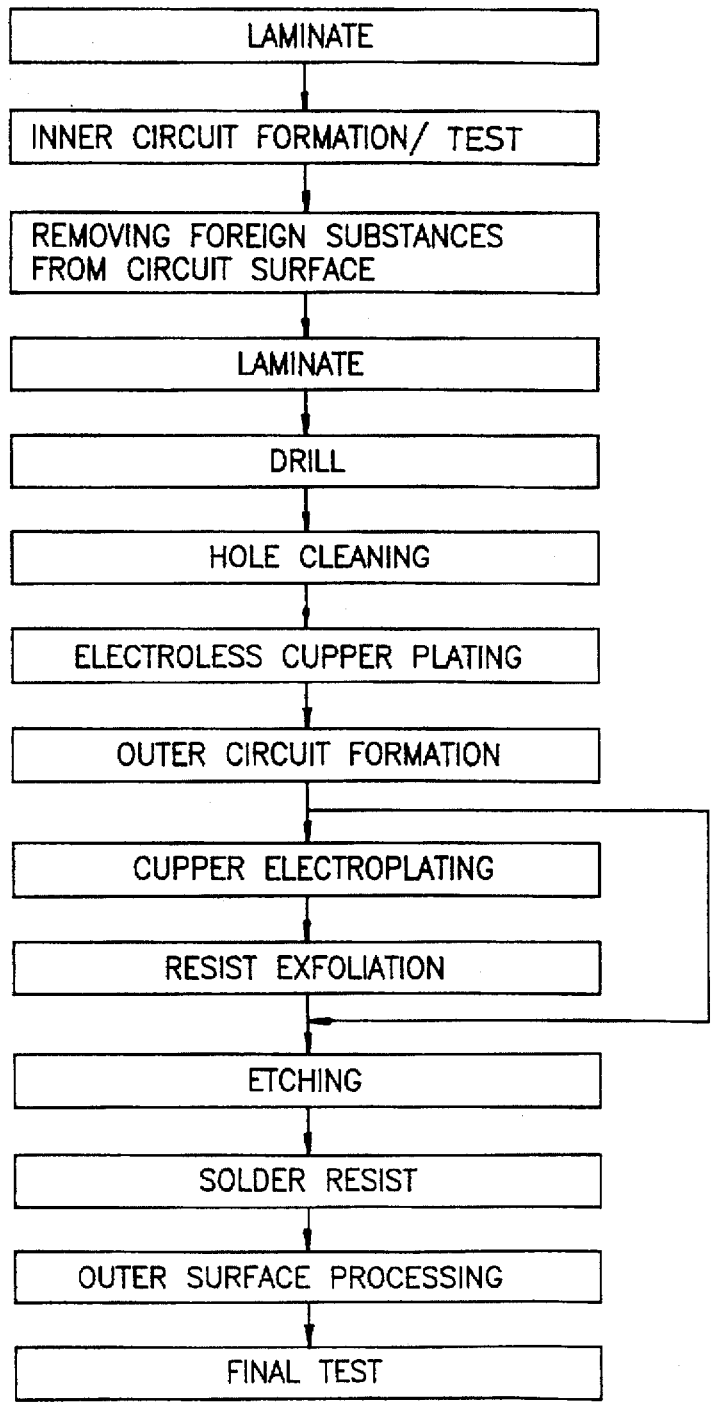
FIG. 2 is a flow chart of a conventional BGA semiconductor package structure.

A semiconductor package substrate and a BGA package using the same in accordance with the present invention is illustrated in FIG. 5. A cavity 10a is formed in the center surface of a substrate 10. Bumpers 16 are provided on the substrate surface adjacent to the cavity 10a so as to prevent possible crackings. Holes 17a and recesses 17b are formed closely to each other in the outer surface of the substrate 10. A package chip 12 is attached by an adhesive 11 to the bottom surface of the cavity 10a.

One end portions of copper wires (not shown), which are embedded in the substrate 10, are each electrically connected by metallic wires 13 to the bond pads of the package chip 12. An epoxy molding compound 14 is formed over the substrate 10 thickly enough to cover the package chip 12 and the metallic wires 13, and to fill the holes 17a and the recesses 17b. A plurality of solder balls 15, attached on the lower surface of the substrate 10, are electrically connected to each of the other end portions of the copper wires (not shown).

Figure 6:
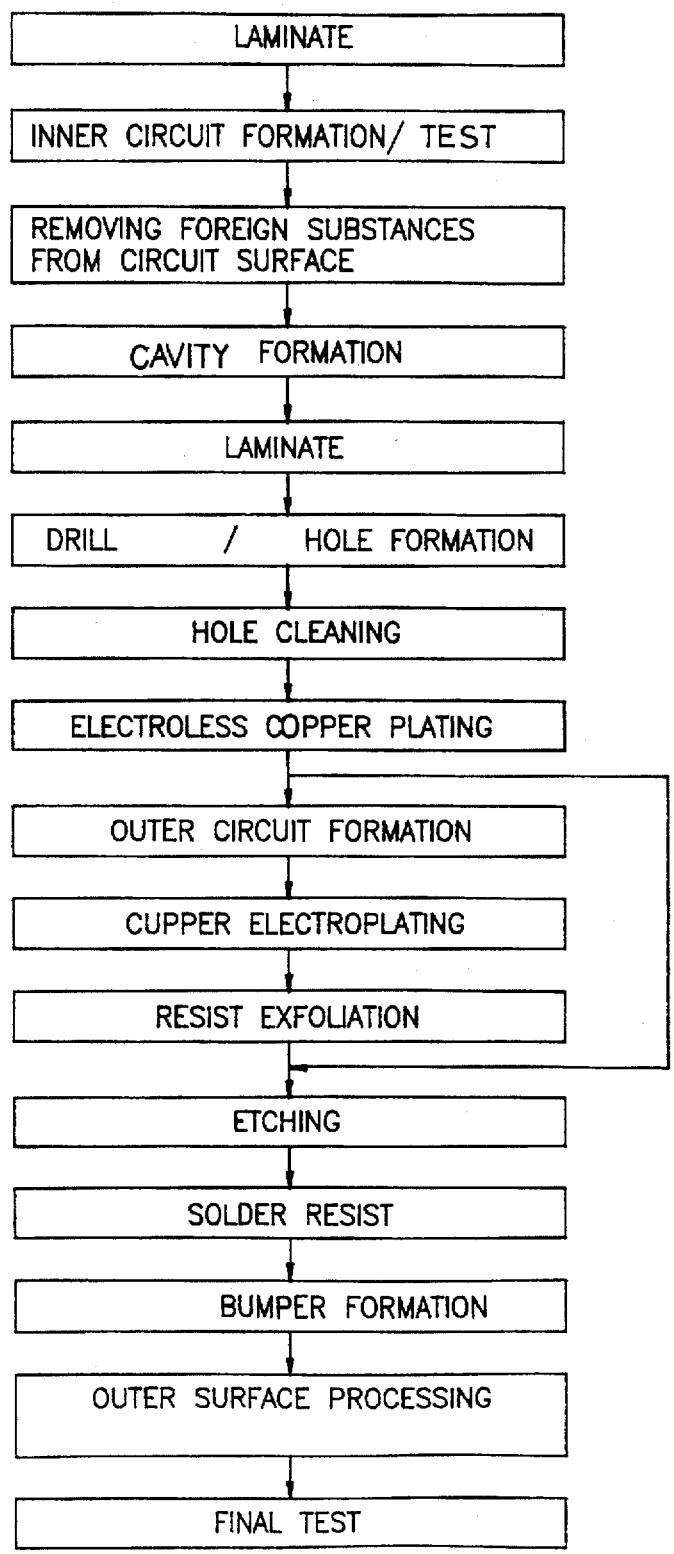
FIG. 6 is a flow chart showing substrate fabrication orders of the BGA semiconductor package in accordance with the present invention.

FIG. 6 is a flow chart viewing the substrate fabrication orders of the BGA semiconductor package, as shown in FIG. 5. The substrate fabrication follow the accompanying orders; thin core lamination→inner circuit formation and its test→removing foreign substances from circuit surface→cavity formation→lamination→drilling and formation of holes and recesses→hole cleaning→electroless copper plating→outer circuit formation→resist exfoliation→etching→solder resist→solder resist crack bumper formation→outer surface processing→final test.

As shown in FIG. 6 and as described above, the substrate fabrication method includes additional steps of forming the cavity 10a, the holes 17a, the recesses 17b, and the crack bumpers 16. The cavity 10a is formed prior to the laminating process in the center surface portion of the substrate 10, using a punching or routing technique. The cavity width is recommended to be not less than the value of the chip width multiplied by a predetermined factor, e.g., 1.1. The holes 17a are formed during the drilling process or the outer surface process, which is performed after solder resisting. The diameter (D) of each of the holes 17a and recess 17b is preferred to be not less than 0.1 mm (D≧0.1 mm). The depth of each of the recess is preferably more than one third the thickness of the substrate 10. The anti-cracking bumpers 16 can be formed of one selected from a solder resister, an epoxy resin, a polyamide resin, a copper foil and a glass fiber.

A solder resister is formed into the bumpers 16 by spreading a solder resist film on the entire substrate surface and thereafter removing excess solder resist. An epoxy resin or a polyamide resin dispensed onto the substrate by a dispenser is processed into the bumpers 16. A copper foil is formed into bumpers 16 through the accompanying steps; electroless copper foliation→outer circuit formation→electrical copper foliation→resist delamination. Also, glass fiber bumpers manufactured in advance by a punching or routing process are formed on the substrate 10.

The cross-sectional view shows the bumper 16 having a square shape. However, as can be appreciated, the bumper may have any appropriate shape. Further, FIG. 8 illustrates the substrate with a plurality of bumpers. As can be appreciated, a single bumper surrounding the cavity may be made. The width of each of the formed bumpers 16 is preferred to be not less than 0.1 mm and not larger than 10 mm (0.1 mm≦bumper width≦10 mm), and its height is preferred to be not less than 0.1 mm and not larger than 5 mm (0.1 mm≦bumper height≦5 mm). The bumpers 16 are preferably formed on the substrate surface portion adjacent to the cavity 10a.

The BGA semiconductor package fabrication method is illustrated in FIGS. 7A through 7C. As shown in FIG. 7A, the substrate 10, formed according to the steps shown in FIG. 6, is provided with a cavity 10a formed near the center surface thereof. A plurality of bumpers 16 are formed on the inner substrate surface around the cavity 10a. A plurality of holes 17a and recesses 17b are formed in the substrate.

As shown in FIG. 7B, a cavity 10a is formed in the center of a substrate 10. Then, a die bonding is performed, wherein a package chip 12, separated through a sawing process, is attached by an adhesive 11 to the bottom surface of the cavity 10a. Thereafter, there is provided a wire bonding process in which a plurality of chip pads (not shown) formed on the substrate surface are electrically connected through the metallic wires 13 to one end portions of the copper wires (not shown) embedded in the substrate 10.

As shown in FIG. 7C, a molding process is performed wherein an epoxy molding compound 14 is formed over the substrate 10 thickly enough to cover the package chip 12 and the metallic wires 13, and to fill the holes 17a and the recesses 17b. Then, according to a solder ball bonding process, the plurality of solder balls 6, attached on the lower surface of the substrate 10, are electrically connected to the other end portions of the copper wires (not shown), thereby completing the BGA package fabrication process.

Meanwhile, the area of the cavity bottom surface is preferred to be not less than that of a package chip being mounted thereon multiplied by a predetermined factor, e.g., 1.1. The bumpers 16 are provided on the inner substrate surface adjacent to the cavity 10a to prevent cracking which can occur on the lower surface of the package chip 12. The width of each of the bumpers 16 is preferred to be not less than 0.1 mm and not larger than 10 mm (0.1 mm≦bumper width≦10 mm). The height is preferably not less than 0.1 mm and not larger than 5 mm (0.1 mm≦bumper height≦5 mm). The anti-cracking bumpers 16 can be formed of one selected from a copper foil, an epoxy resin, a glass fiber and a solder resister.

The plurality of holes 17a and recesses 17b formed in the substrate 10 are each filled by an epoxy molding compound during the molding process. The increased adhesive strength between the substrate 10 and the molding compound 14 enables restraining the delamination phenomenon.

As shown in FIG. 8, there are provided the plurality of holes 17a penetrating the substrate 10 which is formed in the space between copper wires 18 embedded in the substrate 10. The plurality of recesses 17b, reaching a certain depth of the substrate 10 and formed in-between the copper wires 18, are located adjacent to the holes 17a. The diameter (D) of the holes 17a and the recesses 17b is preferably not less than 0.1 mm (D≧0.1 mm). The depth of the recesses 17b is preferably more than one third that of the substrate 10.

With reference to FIG. 9 which is a modification of the FIG. 5 embodiment, a liquid PIQ (Polyamide Isoindoro Quinazorindion) 20 is coated to cover the package chip 12 attached on the bottom surface of the cavity 10a. The epoxy molding compound 14 is formed thereon, so that the high adhesive strength of PIQ causes the package chip 12 to strongly adhere to the molding compound 14, thereby restraining the crackings. More specifically, the PIQ coating process follows the accompanying steps; sawing→die bonding→wire bonding. Finally, a liquid PIQ coating is performed to cover the package chip 12 by a dispensing or screen printing technique.

As described above, the semiconductor package substrate and the BGA package using the same provide a cavity formed in the substrate, anti-cracking bumpers on the inner substrate surface adjacent to the cavity and a plurality of holes and recesses in the substrate, whereby delamination and cracking which may occur during the credibility checkup can be prevented, thereby improving the package reliability.

Further, because the package chip is mounted on the bottom surface of the cavity, the lower package height can be obtained, thereby easily enabling the package lighter, thinner and smaller. Still further, the double molding performed sequentially by PIQ for coating the package chip and the epoxy molding compound for covering the PIQ enables prevention of crackings which may occur at the lower surface of the package chip by the credibility tests, thereby improving the package reliability.

The foregoing embodiment is merely exemplary and not to be construed as limiting the present invention. The present scheme can be readily applied to other types of packages. The description of the present invention is intended to be illustrative, and not limiting the scope of the claims. Many alternatives, modifications and variations will be apparent to those skilled in the art.

I claim:

1. A substrate for a chip package comprising:
    a cavity formed in the substrate;
    a bumper and a plurality of leads for conductive connections to the chip package formed on the substrate adjacent to said cavity; and
    at least one of a plurality of holes and a plurality of recesses formed on the substrate interdispersed between conductive leads for receiving a molding resin.

2. The substrate of claim 1, wherein the square measure of said cavity is larger than that of a package chip being mounted therein by a predetermined factor.

3. The substrate of claim 1, wherein said bumper is formed of a material selected from one of a copper foil, epoxy, resin, glass fiber and solder resister.

4. The substrate of claim 1, wherein said bumper has a width at least equal to about 0.1 mm.

5. The substrate of claim 4, wherein said bumper has a width not greater than about 10 mm.

6. The substrate of claim 1, wherein said bumper has a height at least equal to about 0.1 mm.

7. The substrate of claim 6, wherein said bumper has a height not greater than about 10 mm.

8. The substrate of claim 1, wherein said recesses and holes have a diameter at least equal to about 0.1 mm.

9. The substrate of claim 8, wherein said recesses have a depth at least equal to one third of a substrate thickness.

10. The substrate of claim 1, wherein said bumper substantially surrounds said cavity.

11. A chip package comprising:
    a substrate having a plurality of conductive leads, a cavity at least one bumper formed on said substrate adjacent to said cavity and a plurality of holes and recesses;
    a package chip mounted on the bottom surface of said cavity, wherein the package chip has a plurality of bond pads;
    means for connecting said bonding package pads of said package chip and said plurality of conductive leads and said substrate; and
    a molding compound, formed on said substrate, for packaging said package chip and said connecting means and filling said holes and said recesses, wherein an adhesive strength between the molding compound and said substrate in said holes and said recesses decreases delamination.

12. The package of claim 11, wherein the square measure of the bottom surface of said cavity is larger than that of said package chip by a predetermined factor.

13. The package of claim 11, wherein said bumper is formed of a material selected from one of a copper foil, epoxy resin, glass fiber and solder resister.

14. The package of claim 11, further comprising PIQ filling said cavity and covering said package chip.

15. The package of claim 11, wherein said connecting means comprises a plurality of conductive wires.

16. The package of claim 11, further comprising a plurality of conductive balls coupled to said plurality of conductive leads.

17. The package of claim 11, wherein said molding compound completely covers the package chip.

18. The package of claim 11, wherein said bumper has a width at least equal to about 0.1 mm and not greater than about 10 mm.

19. The package of claim 11, wherein said bumper has a height at least equal to about 0.1 mm and not greater than about 10 mm.

20. The package of claim 11, wherein said recesses and holes have a diameter at least equal to about 0.1 mm.

21. The package of claim 20, wherein said recesses have a depth at least equal to one third of a substrate thickness.

22. The substrate of claim 1, wherein an adhesive strength between the molding resin and at least one of said plurality of holes and recesses decreases delamination.

23. The substrate of claim 10, wherein said bumper is encapsulated by the molding resin.

24. The package of claim 11, wherein said holes and said recesses are interdispersed between said plurality of conductive leads.

25. The package of claim 11, wherein said bumper is a anti-cracking bumper.

* * * * *